United States Patent
Yao

(10) Patent No.: US 8,664,126 B2
(45) Date of Patent: Mar. 4, 2014

(54) SELECTIVE DEPOSITION OF POLYMER FILMS ON BARE SILICON INSTEAD OF OXIDE SURFACE

(75) Inventor: Daping Yao, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 124 days.

(21) Appl. No.: 13/456,524

(22) Filed: Apr. 26, 2012

(65) Prior Publication Data

US 2012/0315740 A1    Dec. 13, 2012

Related U.S. Application Data

(60) Provisional application No. 61/495,850, filed on Jun. 10, 2011.

(51) Int. Cl.
*H01L 21/31*    (2006.01)

(52) U.S. Cl.
USPC .......................................... 438/766; 438/769

(58) Field of Classification Search
USPC .......................................... 438/468, 766, 769
See application file for complete search history.

(56) References Cited

U.S. PATENT DOCUMENTS

| | | | |
|---|---|---|---|
| 7,465,642 B2 | 12/2008 | Cheng et al. | |
| 7,732,269 B2 | 6/2010 | Kim et al. | |
| 7,811,881 B2 | 10/2010 | Cheng et al. | |
| 2002/0027205 A1 | 3/2002 | Liu et al. | |
| 2002/0106850 A1 | 8/2002 | Iguchi et al. | |
| 2006/0008961 A1 | 1/2006 | Lee et al. | |
| 2006/0068553 A1 | 3/2006 | Thean et al. | |
| 2007/0161216 A1 | 7/2007 | Bauer | |
| 2009/0081858 A1* | 3/2009 | Qin et al. | 438/527 |
| 2009/0203197 A1 | 8/2009 | Hanawa et al. | |
| 2011/0124169 A1 | 5/2011 | Ye et al. | |
| 2012/0187524 A1* | 7/2012 | Huang et al. | 257/506 |
| 2012/0309114 A1* | 12/2012 | Yao et al. | 438/4 |

OTHER PUBLICATIONS

International Search Report for PCT/US2012/037529 dated Feb. 1, 2013.

* cited by examiner

*Primary Examiner* — Lex Malsawma
(74) *Attorney, Agent, or Firm* — Patterson & Sheridan, LLP

(57) ABSTRACT

A method of selective deposition on silicon substrates having regions of bare silicon and regions of oxide formed thereon. The method includes placing the substrate on a wafer support inside a processing chamber, introducing a carbon-containing gas into the reactor, applying a bias to the substrate, generating a plasma from the hydrocarbon gas, implanting carbon ions into the regions of oxide on the substrate by a plasma doping process, and depositing a carbon-containing film on the bare silicon regions.

22 Claims, 4 Drawing Sheets

SELECTIVE DEPOSITION OF POLYMER FILMS ON BARE SILICON INSTEAD OF OXIDE SURFACE

CROSS-REFERENCE TO RELATED APPLICATIONS

This application claims benefit of U.S. Provisional Patent Application Ser. No. 61/495,850, filed Jun. 10, 2011, which is herein incorporated by reference.

BACKGROUND OF THE INVENTION

1. Field of the Invention

Embodiments of the present invention generally relate to selective deposition on a substrate.

2. Description of the Related Art

As geometries of integrated circuits are reduced to enable faster integrated circuits, the need for highly selective deposition of films increases. Sometimes the geometries may be reduced so much that etching of masking layers may not be feasible. In such cases, selective deposition of masking layers is desirable so as to reduce the need for etching the masking layers.

In some situations, for example, a device (such as a memory or logic device), having undergone front-end processing, may have oxide regions and silicon regions formed on its front side. The oxide regions may require subsequent etching to form gates, vias, contact holes, or interconnect lines, while the silicon regions will need to be masked from the etchant. Typically, a polymer film may be deposited and then etched to form a masking layer over the silicon regions of the substrate. However, etching is sometimes not practicable when small geometries are involved. Therefore, there is a need to produce masked layers of polymer coatings directly on the substrate, in which the polymer is selectively deposited only on areas that need to be masked, so that etching of the polymer layer following deposition is not necessary. Ideally, certain regions may be covered by the polymer and other regions of the substrate may be left bare.

SUMMARY OF THE INVENTION

The present invention generally relates to selective deposition on a substrate. In one embodiment, a method of selective deposition of a polymer film is provided, the method comprising providing a substrate having regions of silicon and regions of oxide on a surface of the substrate, placing the substrate in a processing chamber, introducing a hydrocarbon gas into the processing chamber, and depositing a carbon-containing layer on the regions of silicon of the substrate using a plasma doping process, such as plasma immersion ion implantation.

In one embodiment, a method of selective deposition can include a substrate having silicon regions and oxide regions on a surface of the substrate. The substrate can be placed on a substrate support in a processing chamber, after which the substrate could be electrically biased. When the substrate is biased to the desired level, a hydrocarbon gas can be introduced into the processing chamber. The hydrocarbon gas can then be deposited as a carbon-containing layer on the silicon regions and implanted into the oxide region of the substrate using a plasma doping process, such as plasma immersion ion implantation.

In another embodiment, a method of selective deposition on non-oxide containing regions of a substrate can include providing a substrate which can have regions of silicon and regions of oxide on a surface of the substrate. The substrate can be placed in a processing chamber where is can be electrically biased. By introducing a hydrocarbon gas into the chamber, a carbon-containing layer can be deposited both onto and into the regions of exposed silicon while simultaneously depositing into the oxide regions, due to the increased bias at the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally relate to a method of selective deposition of polymer films on silicon substrates having regions of bare silicon and regions of oxide formed thereon. In one embodiment, the method includes placing the substrate on a wafer support inside a processing chamber, introducing a carbon-containing gas (such as $CH_4$, $C_2H_4$, $C_2H_6$, or $C_3H_8$) into the reactor, applying a bias to the substrate, generating a plasma from the hydrocarbon gas, and implanting carbon ions into the substrate by a plasma doping process, wherein a carbon-containing film is deposited on the bare silicon regions but not on the oxide regions.

Figure 1A:
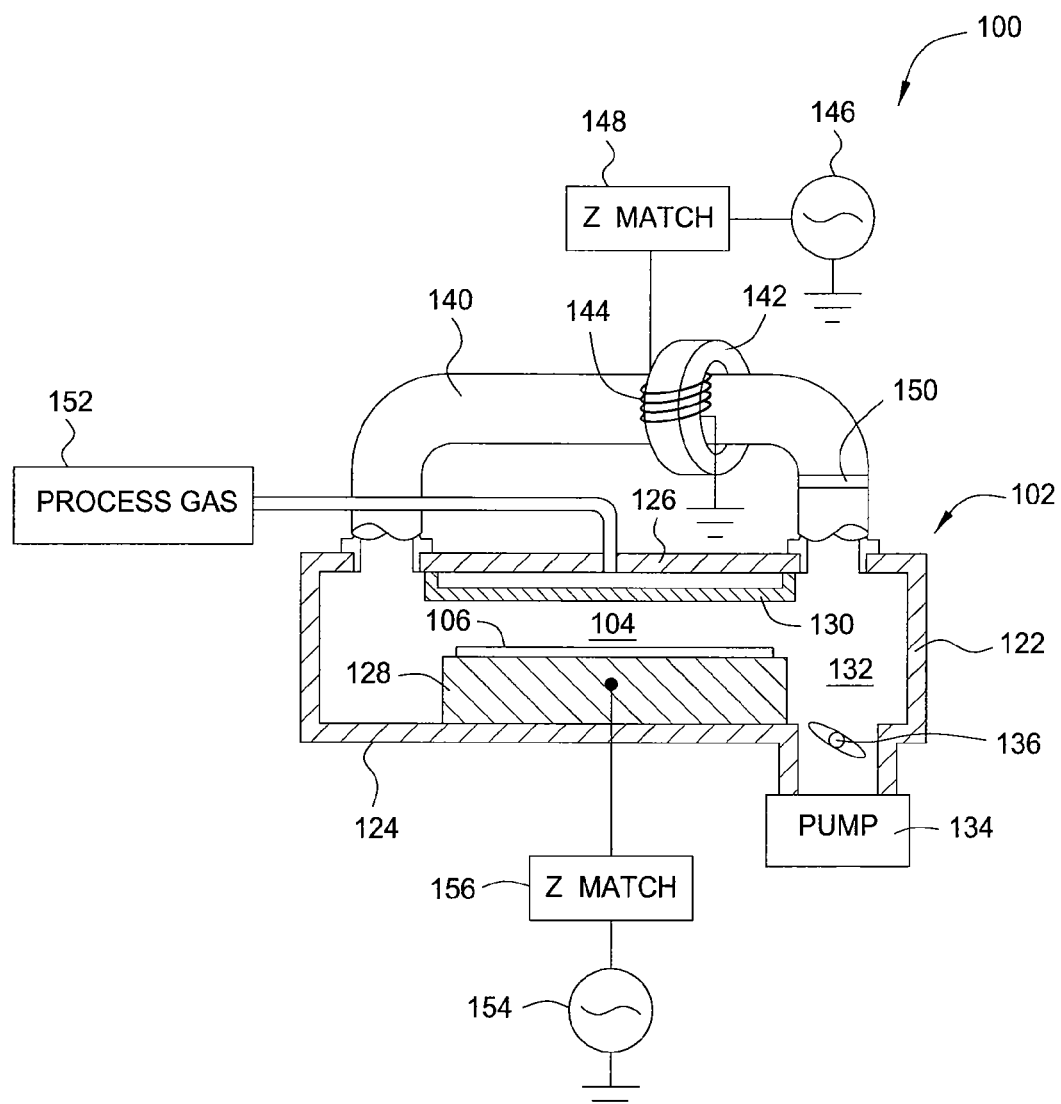
FIGS. 1A and 1B show one embodiment of a plasma doping tool suitable for practicing the method disclosed herein.

FIG. 1A depicts a processing chamber 100 that may be utilized to practice an ion implantation process according to one embodiment of the invention. One suitable reactor in which a plasma immersion ion implantation process may be practiced is a P3i® reactor, available from Applied Materials, Inc., of Santa Clara, Calif. It is contemplated that the methods described herein may be practiced in other suitably adapted plasma reactors, including those from other manufacturers.

The processing chamber 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. The substrate may optionally be supported on an electrostatic chuck. A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A process gas source 152 is coupled to the gas distribution plate 130 to supply gaseous precursor compounds for processes performed on the substrate 106.

Figure 1B:
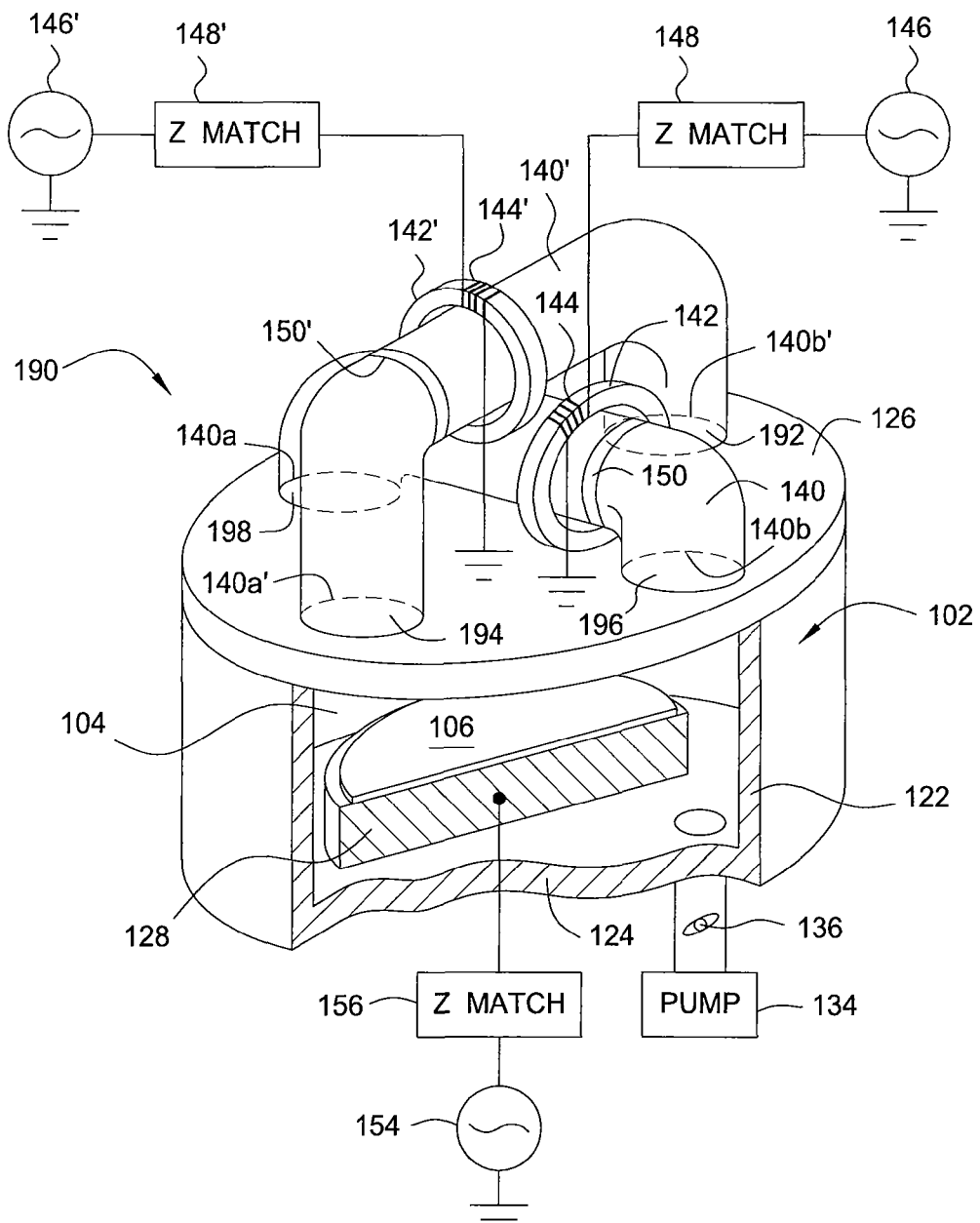

The processing chamber 100 depicted in FIG. 1A further includes a plasma source 190, best shown in the perspective view of FIG. 1B. The plasma source 190 includes a pair of separate external reentrant conduits (first external reentrant conduit 140, second external reentrant conduit 140') mounted on the outside of the top 126 of the chamber body 102, disposed transverse to one another (or orthogonal to one another as the exemplary embodiment depicted in FIG. 1B). The first external reentrant conduit 140 has a first end 140$a$ coupled through an opening 198 formed in the top 126 into a first side of the process region 104 in the chamber body 102. A second end 140$b$ has an opening 196 coupled into a second side of the process region 104. The second external reentrant conduit 140' has a first end 140$a$' having an opening 194 coupled into a third side of the process region 104 and a second end 140$b$' having an opening 192 into a fourth side of the process region 104. In one embodiment, the first external reentrant conduit 140 and the second external reentrant conduit 140' are configured to be orthogonal to one another, thereby providing the first end 140$a$, second end 140$b$, and first end 140$a$' and second end 140$b$', of each first external reentrant conduit 140 and second external reentrant conduit 140', respectively, disposed at about 90 degree intervals around the periphery of the top 126 of the chamber body 102. The orthogonal configuration of the first external reentrant conduit 140 and second external reentrant conduit 140' allows a plasma source to be distributed uniformly across the process region 104. It is contemplated that the first external reentrant conduit 140 and the second external reentrant conduit 140' may be configured as other distributions utilized to provide uniform plasma distribution into the process region 104.

Magnetically permeable toroidal cores 142, 142' surround a portion of a corresponding one of the first external reentrant conduit 140 and second external reentrant conduit 140'. The conductive coils 144, 144' are coupled to respective RF plasma source power generators 146, 146' through respective impedance match circuits or elements 148, 148'. Each one of the first external reentrant conduit 140 and second external reentrant conduit 140' is a hollow conductive tube interrupted by an insulating annular ring 150, 150' respectively that interrupts an otherwise continuous electrical path between the first end 140$a$ and second end 140$b$ (and first end 140$a$', second end 104$b$') of the respective first external reentrant conduit 140 and second external reentrant conduit 140'. Ion energy at the substrate surface is controlled by an RF plasma bias power generator 154 coupled to the substrate support assembly 128 through an impedance match circuit or element 156.

Referring back to FIG. 1A, process gases including gaseous compounds supplied from the process gas source 152 are introduced through the gas distribution plate 130 into the process region 104. One of the magnetically permeable toroidal cores 142, 142' combines with one of the conductive coils 144, 144' to form a power applicator. RF source plasma power generator 146 is coupled from the power applicator (magnetically permeable toroidal core 142 and conductive coil 144) to gases supplied in the first external reentrant conduit 140, which creates a circulating plasma current in a first closed toroidal path including the first external reentrant conduit 140 and the process region 104. Also, RF plasma source power generator 146' may be coupled from the other power applicator (magnetically permeable toroidal core 142' and conductive coil 144') to gases in the second external reentrant conduit 140', which creates a circulating plasma current in a second closed toroidal path transverse (e.g., orthogonal) to the first toroidal path. The second closed toroidal path includes the second external reentrant conduit 140' and the process region 104. The plasma currents in each of the paths oscillate (e.g., reverse direction) at the frequencies of the respective RF plasma source power generators 146, 146', which may be the same or slightly offset from one another.

In one embodiment, the process gas source 152 may provide a process gas mixture that may be utilized to provide ions implanted to the substrate 106. For purposes of the method disclosed herein, suitable examples of process gases include carbon-containing gases such as methane ($CH_4$), ethene ($C_2H_4$), ethane ($C_2H_6$), and propane ($C_3H_8$), among others. In some embodiments, the process gas mixture may also include a dilutant gas such as $H_2$, He, or Ar. The power of each RF plasma source power generators 146, 146' is operated so that their combined effect efficiently dissociates the process gases supplied from the process gas source 152 and produces a desired ion flux at the surface of the substrate 106. The power of the RF plasma bias power generator 154 is controlled at a selected level at which the ion energy dissociated from the process gases may be accelerated toward the substrate surface and implanted at a desired depth below the top surface of substrate 106 with desired ion concentration. For example, with relatively low RF power, such as less than about 500 W, ions are excited with relatively low energy. The low energy ions may be implanted at a shallow depth less than about 100 Å from the substrate surface. Alternatively, ions with high energy provided and generated from high bias RF power, such as higher than about 3000 W, may be implanted into the substrate having a depth substantially over 100 Å from the substrate surface.

The combination of the controlled RF plasma source power and RF plasma bias power dissociates carbon ions in the gas mixture having sufficient momentum and desired ion distribution in the processing chamber 100. The ions are biased and driven toward the substrate surface, thereby implanting ions into oxide regions on both flat and side wall surfaces of the substrate, with desired ion concentration, distribution and depth from the substrate surface. The depth and concentration of implanted carbon ions may be controlled by the amount of energy applied to the substrate surface, which is controlled by the bias power.

Figure 2:
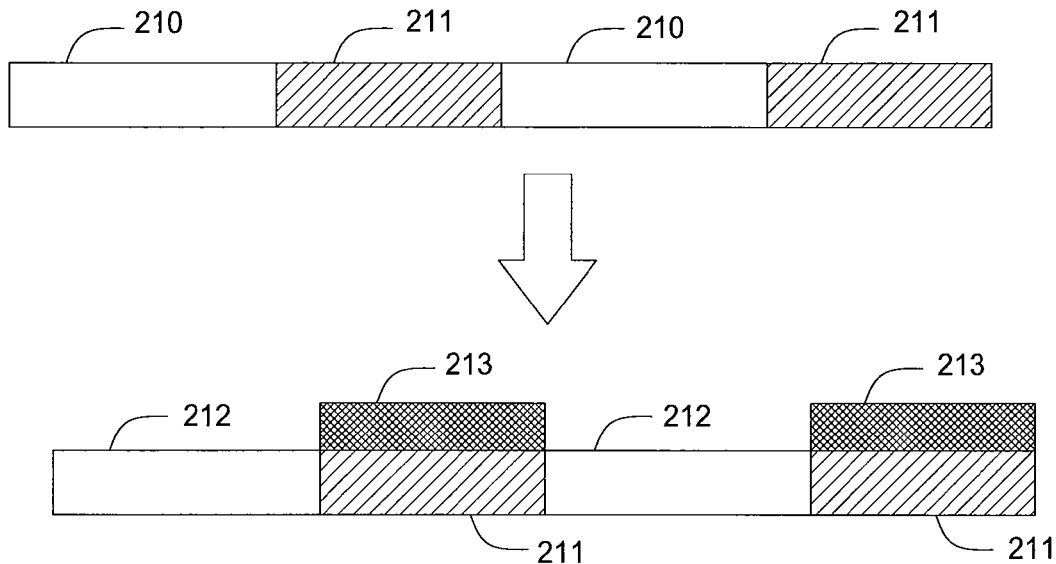
FIG. 2 depicts a simplified vertical cross-sectional view of a front layer of a substrate, before and after the selective deposition method described herein.
Figure 3:
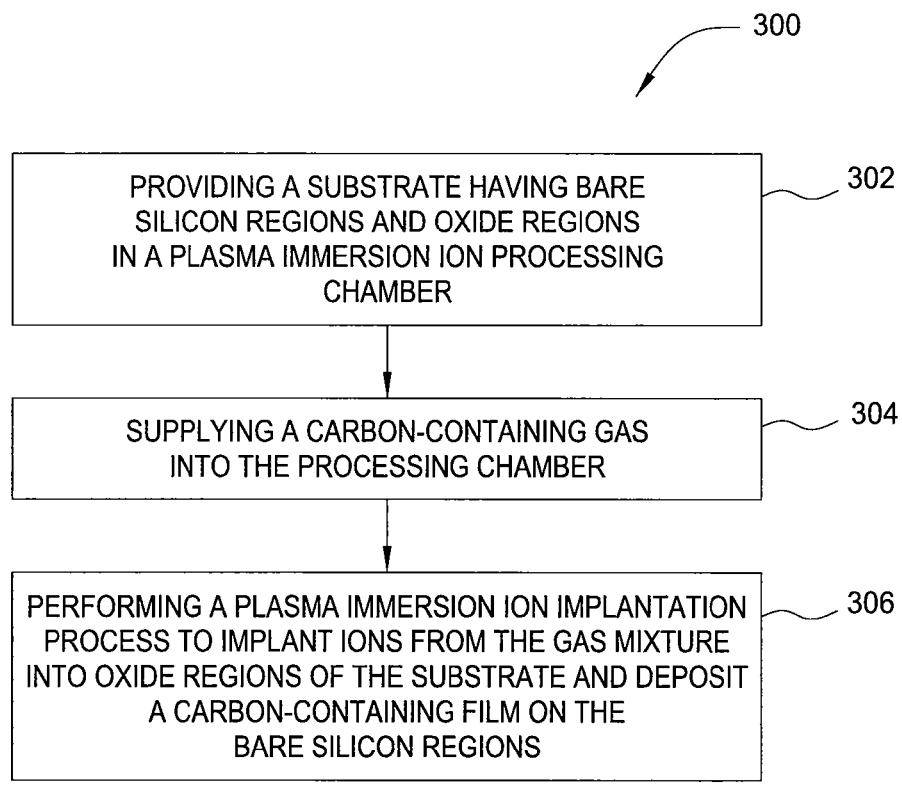
FIG. 3 depicts a process flow diagram of the method disclosed herein.

FIG. 2 depicts a simplified vertical cross-sectional view of a front layer of a substrate, before and after the selective deposition described herein. FIG. 3 depicts a process flow diagram of a method 300 for depositing a carbon-containing layer on bare silicon regions of a substrate and implanting carbon ions into oxide regions of the substrate by a plasma doping process. The method 300 may be performed in a plasma immersion ion implantation processing chamber, such as the processing chamber 100, as described in FIGS. 1A and 1B. The method 300 begins at step 302 by introducing a substrate having bare silicon regions (see FIG. 2 at 211) and oxide regions (see FIG. 2 at 210) on its surface into an immersion ion implantation processing chamber. The substrate may be a material such as crystalline, strained silicon, silicon germanium, doped or undoped polysilicon, doped or undoped silicon wafers, or doped silicon. The substrate may have various dimensions, such as 200 mm or 300 mm diameter wafers, as well as rectangular or square panes. Unless otherwise noted, embodiments and examples described herein are conducted on substrates having a 300 mm diameter.

In one embodiment, the substrate 106 may be a wafer having undergone front-end processing, such as in chemical-mechanical polishing (CMP) applications, wherein an oxide layer has been deposited on a bare silicon wafer and patterned or etched using techniques known in the art so that the wafer has bare silicon regions 211 and oxide regions 210 on its front side. The oxide may include, for example, a silicon oxide or germanium oxide. For purposes of simplification, only the topmost layer of the wafer is shown in FIG. 2, and underlying layers, if any, are not shown.

At step 304, a carbon-containing gas such as $CH_4$, $C_2H_4$, $C_2H_6$, and $C_3H_8$, is supplied into the processing chamber 100 to provide ion species for the subsequent deposition and implantation process. In one embodiment, the carbon-containing gas may be a hydrocarbon having five carbon atoms or less per molecule. The carbon-containing gas may be supplied from the process gas source 152 to the gas distribution plate 130, as described in FIG. 1A, or by other suitable means. The carbon-containing gas provides the carbon to be deposited on the bare silicon regions of the substrate and the desired ions to be implanted into the oxide regions of the substrate. In one embodiment, the gas supplied into the processing chamber 100 may also include a dilution gas such as $H_2$, He or Ar to better control the carbon deposition profile. The dilution gas in the processing chamber 100 may result in better carbon deposition profile control and promote the ion bombardment in the gas mixture, thereby efficiently increasing the possibility of process gas collision, resulting in reduced recombination of ion species.

At step 306, a plasma doping process is performed to implant ions generated from the gas mixture at step 304 into the oxide regions 210 of the substrate and deposit a carbon-containing film 213 on the bare silicon regions 211 of the substrate, as shown in FIG. 2. A RF source power is applied to generate a plasma from the gas mixture in the processing chamber 100. The generated plasma dissociates the gas mixture in the processing chamber 100 as ion species. A RF bias power may be applied to the substrate along with the RF source power applied to the plasma source to dissociate and drive the dissociated ion species from the gas mixture toward and into a desired depth from the substrate surface at the oxide regions.

Generally, when there is no bias power supplied to the substrate, the carbon containing layer can be deposited similarly on both the exposed silicon surface and the oxide surface. In one embodiment, at a fixed process time when the plasma immersion (implant) energies were 6 kV-8 kV, corresponding to the substrate which was biased at powers of 3000-4000 W, transmission electron microscope (TEM) pictures showed the Si surface had a polymer layer with thickness of at least 40 Å, but oxide surface had no polymer deposited thereon. In another embodiment, under the measurement of x-ray photoelectron spectroscopy (XPS), where the samples were processed with higher energy and longer processing time, the bare silicon surfaces had greater than 100 Å of carbon containing layer formation, while the oxide surface still had no detectable polymer formation. Even at a fourfold increase in the processing time with all other conditions remaining constant, a carbon containing layer was not detected on the oxide layer.

The RF source and bias power applied to the processing chamber 100 can be controlled at a desired energy level, thereby allowing the ion species to be dissociated and doped with a desired concentration and depth in the oxide regions of the substrate. Increasing RF source power generally increases the quantity of carbon available for deposition or implantation due to increased ionization of the process gas. Increasing the RF bias power generally increases the implantation depth of carbon into the oxide regions of the substrate. It is to be noted that when using a reduced RF bias or no RF bias, carbon may simply deposit on the oxide region rather than implant into the oxide region. Additionally, under relatively greater RF biases, carbon may be implanted into bare silicon regions, in addition to or as alternative to deposition on the bare silicon regions. As shown in FIG. 2, the substrate resulting from the selective deposition method described herein will have a carbon-containing film 213 over bare silicon regions 211 and oxide regions 212 will be exposed.

In one embodiment, the source RF power may be maintained at between about 100 Watts and about 1000 Watts at a frequency of about 13.56 MHz. In one embodiment, the source RF can be turned off (0 W of power) after the bias RF is turned on and a stable plasma can be achieved. The bias RF power may be maintained at between about 100 Watts and about 5000 Watts at a frequency of about 2 MHz. In one embodiment, the source RF power may be 400 W (at 13.56 MHz) and the bias power may be 4000 W (at 2 MHz).

Several process parameters may also be regulated during the plasma doping process at step 306. In one embodiment, the chamber pressure may be maintained at between about 5 mTorr and about 15 mTorr. A higher chamber pressure may result in a thicker carbon-containing film deposited on the bare silicon regions of the substrate. The chamber temperature may be maintained at between about 50 degrees Celsius and about 90 degrees Celsius. The wafer temperature, which may be controlled using the electrostatic chuck, may be maintained at between about 0 degrees Celsius and about 100 degrees Celsius. In one embodiment, the chamber pressure may be 7 mTorr, the chamber temperature may be 65 degrees Celsius and the wafer temperature may be 30 degrees Celsius.

The gas mixture flow rate and/or gas mixture flow ratio among the reacting gas and the dilution gas supplied at step 304 may be selected to control the relative amounts of the dissociated ion species between each type of gases. The selected gas mixture flow rate and/or flow ratio enables the gas mixture to be dissociated at a predetermined amount and/or ratios among different kinds of ion species, thereby preventing generating excess amount of certain types of ions in the processing chamber, resulting in unwanted side reaction and/or forming undesired film on the substrate. For example, an excess amount of certain type of ion species, such as hydrogen, helium, or argon ions, may sputter and bombard the substrate surface, thereby damaging and roughening the substrate surface.

In one embodiment, the flow rate ratio of the carbon-containing gas and the dilution gas may be controlled at between about 1:20 and about 1:0.5. In one embodiment, the carbon-containing gas may be flowed into the processing chamber at a rate of between about 2 sccm and about 100 sccm, such as between about 10 sccm and about 50 sccm. The dilution gas may be flowed in to the processing chamber at a rate between about 20 sccm and about 200 sccm, such as between about 50 sccm and about 100 sccm.

In an exemplary embodiment of the invention, the gas mixture may include $CH_4$ and $H_2$. In one embodiment, the $CH_4$ gas and the $H_2$ gas may have a flow rate ratio of about 1:9. The $CH_4$ gas may be supplied at a rate of 10 sccm and the $H_2$ gas may be supplied at a rate of 90 sccm. In another exemplary embodiment of the invention, the gas mixture may include $CH_4$ and He. In one embodiment, the $CH_4$ gas and the He gas may have a flow rate ratio between about 1:20 and about 1:1, such as 1:9. The $CH_4$ gas may be supplied at a rate of 10 sccm and the He gas may be supplied at a rate of 90 sccm for a 300 mm substrate. The source RF power in either embodiment may be controlled at between about 100 Watts and about 1000 Watts and the bias RF power may be controlled at between about 100 Watts and about 5000 Watts.

In another exemplary embodiment according to the present invention, only the carbon-containing gas may be supplied. For example, 50 sccm of $CH_4$ may be supplied with no dilution gas. The source RF power may be controlled at between about 100 Watts and between about 50 Watts and about 1000 Watts and the bias RF power may be controlled at between about 100 Watts and about 5000 Watts.

Figure 4:
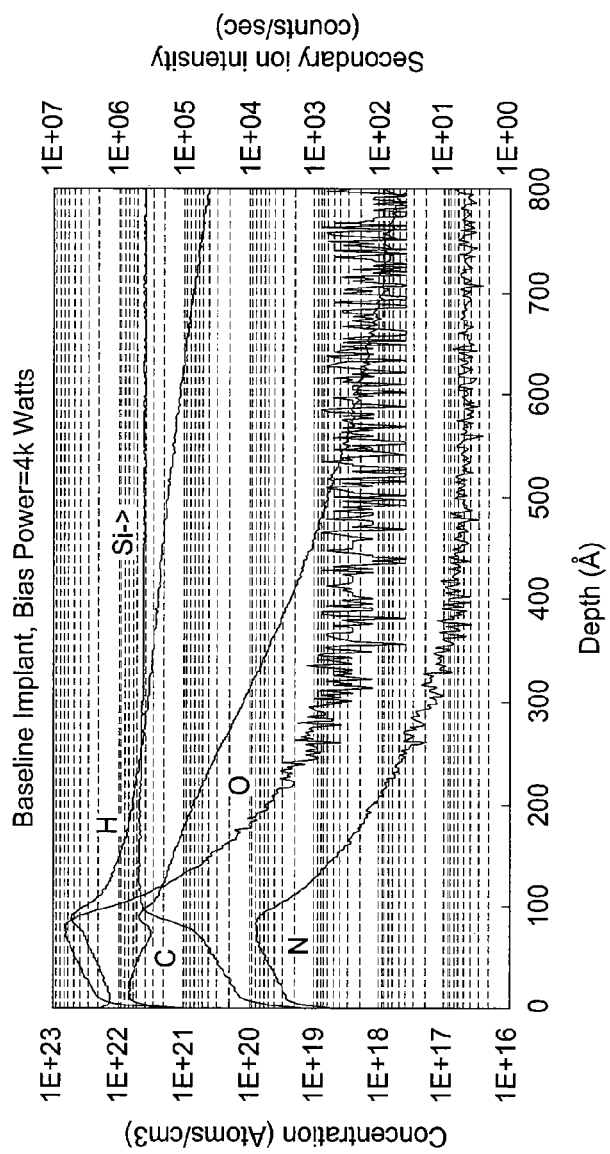
FIG. 4 is a secondary ion mass spectrometry (SIMS) profile showing the concentrations of elements versus depth in a substrate treated using the method disclosed herein.

FIG. 4 is a secondary ion mass spectrometry (SIMS) profile showing the concentrations of elements versus depth at an oxide region of a substrate treated using the method disclosed herein. An oxide layer was formed on a crystalline silicon substrate. The substrate was then exposed to methane using the method described herein. As shown in FIG. 4, carbon was implanted into the oxide layer and into the substrate. A carbon-containing film was not deposited over the oxide layer. Moreover, some of the crystalline silicon near the interface with the oxide layer was made amorphous due to the hydrogen implanted.

Figure 5:
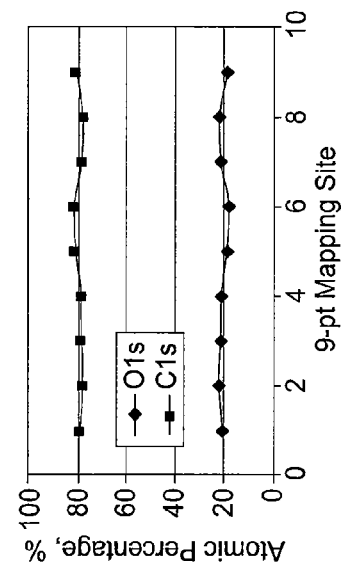
FIG. 5 is a graph of X-ray photoelectron spectroscopy (XPS) measurements for a bare silicon substrate having undergone the selective deposition method described herein.

FIG. 5 is a graph of the atomic percentage of elements as measured by X-ray photoelectron spectroscopy (XPS) for a bare silicon substrate (having no oxide regions) having undergone the selective deposition method described herein. Following the deposition, no silicon signal is detected. Instead, the substrate surface has a high atomic percentage (approximately 80%) of carbon, indicating that a carbon-containing film having a thickness of at least 50 Å was deposited on the surface of the bare silicon substrate. The 20% atomic percentage of oxide is a result of native oxide already present in the silicon (e.g., a result of exposure of the substrate to ambient air).

The limited data indicated the ratios of deposition on the bare silicon regions to deposition on the oxide regions were from 1:1 to approximately 20:1. The bias RF power (plasma immersion energy) is the main criteria to tune the selectivity. The source RF power can also influence the selectivity variation, as increasing the source power is believed to increase the penetration into both the silicon and oxide regions.

Thus, methods for the selective deposition of carbon-containing films over substrates having bare silicon regions and oxide regions by plasma doping processes are provided. The improved method advantageously selectively deposits a carbon-containing film only on the areas in which it is ultimately desired, so that patterning of the polymer layer following deposition is not necessary. This is beneficial in the production of integrated circuits having small geometries, in which patterning is sometimes not feasible. Regions of bare silicon on the substrate may be covered, and protected from further processing, by the polymer while oxide regions on the substrate may be left exposed.

While the foregoing is directed to embodiments of the present invention, other and further embodiments of the invention may be devised without departing from the basic scope thereof, and the scope thereof is determined by the claims that follow.

The invention claimed is:

1. A method of deposition, comprising:
    selectively depositing a carbon-containing layer on a silicon region of a substrate from carbon-containing ions generated from a carbon-containing gas, wherein the substrate comprises at least one silicon region and at least one oxide region; and
    selectively implanting carbon-containing ions into the oxide region of the substrate.

2. The method of claim 1, wherein the carbon-containing gas comprises molecules having 5 carbon atoms or less.

3. The method of claim 1, wherein the carbon-containing gas is $CH_4$, $C_2H_4$, $C_2H_6$, or $C_3H_8$.

4. The method of claim 1, wherein the chamber pressure is maintained at between about 5 mTorr and about 15 mTorr.

5. The method of claim 1, further comprising diluting the carbon-containing gas with a dilution gas.

6. The method of claim 5, wherein the dilution gas is argon (Ar), hydrogen ($H_2$) or helium (He).

7. The method of claim 5, wherein the ratio of carbon-containing gas to dilution gas is between about 1:20 and about 1:0.5.

8. The method of claim 5, wherein the ratio of carbon-containing gas to dilution gas is about 1 to 9.

9. The method of claim 1, further comprising electrically biasing the substrate.

10. The method of claim 9, wherein the electrical bias is increased to increase the depth of implantation of the carbon-containing ions into the oxide layer.

11. A method of deposition, comprising:
    selectively depositing a carbon-containing layer on a silicon region of a substrate from carbon-containing ions generated from a carbon-containing gas, wherein the substrate comprises at least one silicon region and at least one oxide region; and
    implanting at least a portion of the carbon containing ions into both the silicon region and the oxide region.

12. The method of claim 11, wherein the carbon-containing gas comprises molecules having 5 carbon atoms or less.

13. The method of claim 11, wherein the carbon-containing gas is $CH_4$, $C_2H_4$, $C_2H_6$, or $C_3H_8$.

14. The method of claim 11, wherein the chamber pressure may be maintained at between about 5 mTorr and about 15 mTorr.

15. The method of claim 11, further comprising diluting the carbon-containing gas with a dilution gas.

16. The method of claim 15, wherein the dilution gas is argon (Ar), hydrogen ($H_2$) or helium (He).

17. The method of claim 15, wherein the ratio of carbon-containing gas to dilution gas is between about 1:20 and about 1:0.5.

18. The method of claim 15, wherein the ratio of carbon-containing gas to dilution gas is about 1 to 9.

19. The method of claim 15, further comprising altering an RF source power of the plasma doping process to control the amount of deposition or implantation of carbon, wherein an increase in the RF source power leads to an increase in amount of carbon deposited or implanted.

20. The method of claim 11, further comprising electrically biasing the substrate.

21. The method of claim 20, wherein the electrical biased uses an RF power source.

22. The method of claim 21, wherein the electrical bias is controlled at a level at which an ion dissociated from the process gases is accelerated toward the substrate surface and implanted at a desired depth below the top surface of substrate with a desired ion concentration.

* * * * *